(12) United States Patent
Song et al.

(10) Patent No.: US 11,532,754 B2
(45) Date of Patent: Dec. 20, 2022

(54) ARRAY SUBSTRATE WITH AMORPHOUS SILICON SHIELDING LAYER, MANUFACTURING METHOD THEREOF, DISPLAY PANEL, AND DISPLAY APPARATUS

(71) Applicant: BOE TECHNOLOGY GROUP CO., LTD., Beijing (CN)

(72) Inventors: Zhen Song, Beijing (CN); Guoying Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 825 days.

(21) Appl. No.: 16/334,354

(22) PCT Filed: Nov. 1, 2018

(86) PCT No.: PCT/CN2018/113448
§ 371 (c)(1),
(2) Date: Mar. 18, 2019

(87) PCT Pub. No.: WO2019/085973
PCT Pub. Date: May 9, 2019

(65) Prior Publication Data
US 2021/0359139 A1    Nov. 18, 2021

(30) Foreign Application Priority Data
Nov. 3, 2017    (CN) .......................... 201711068127.7

(51) Int. Cl.
H01L 29/786 (2006.01)
H01L 27/12 (2006.01)
(Continued)

(52) U.S. Cl.
CPC .... *H01L 29/78633* (2013.01); *H01L 27/1259* (2013.01); *G02F 1/136209* (2013.01); *H01L 27/3272* (2013.01)

(58) Field of Classification Search
CPC ........... H01L 29/78633; H01L 27/1259; H01L 27/3272; H01L 27/3244; H01L 27/1218; G02F 1/136209
(Continued)

(56) References Cited

U.S. PATENT DOCUMENTS

2006/0045966 A1\* 3/2006 Suzuki .................. G03F 7/2022
427/164
2007/0002199 A1\* 1/2007 Fujikawa .......... G02F 1/136209
349/43
(Continued)

FOREIGN PATENT DOCUMENTS

| CN | 101022085 A | 8/2007 |
| CN | 107046042 A | 8/2017 |
| KR | 20160049172 | \* 5/2022 |

OTHER PUBLICATIONS

International Search Report in PCT application No. PCT/CN2018/113448, dated Jan. 30, 2019.

*Primary Examiner* — Duy T Nguyen
(74) *Attorney, Agent, or Firm* — Syncoda LLC; Feng Ma

(57) ABSTRACT

An array substrate includes a substrate, an active layer, and an amorphous silicon shielding layer. The substrate has a first surface and a second surface, which are opposing to each other. The active layer is over the first surface of the substrate. The amorphous silicon shielding layer includes amorphous silicon, and is between the active layer and the substrate, or alternatively is disposed over a side of the substrate proximal to the second surface of the substrate. An orthographic projection of the amorphous silicon shielding layer on the first surface at least partially and preferably (Continued)

completely covers an orthographic projection of the active layer on the first surface such that the amorphous silicon shielding layer shields a light from shedding onto the active layer.

15 Claims, 14 Drawing Sheets

(51) Int. Cl.
*H01L 27/32* (2006.01)
*G02F 1/1362* (2006.01)

(58) Field of Classification Search
USPC .......................................................... 257/72
See application file for complete search history.

(56) References Cited

U.S. PATENT DOCUMENTS

| | | | |
|---|---|---|---|
| 2007/0210344 A1* | 9/2007 | Arao | H01L 27/1464 257/E27.133 |
| 2009/0014721 A1 | 1/2009 | Tanabe | |
| 2009/0133753 A1* | 5/2009 | Sasaki | H01L 31/075 427/74 |
| 2014/0151708 A1* | 6/2014 | Jeon | H01L 29/7869 438/158 |
| 2016/0020264 A1* | 1/2016 | Choo | H01L 27/1225 257/40 |
| 2016/0133473 A1 | 5/2016 | Wang et al. | |

* cited by examiner

ARRAY SUBSTRATE WITH AMORPHOUS SILICON SHIELDING LAYER, MANUFACTURING METHOD THEREOF, DISPLAY PANEL, AND DISPLAY APPARATUS

CROSS-REFERENCE TO RELATED APPLICATION

The present application claims priority to Chinese Patent Application No. CN 201711068127.7 filed on Nov. 3, 2017, the disclosure of which is hereby incorporated by reference in its entirety.

TECHNICAL FIELD

The disclosure relates generally to the display technologies, and more specifically to an array substrate and its manufacturing method, a display panel, and a display apparatus.

BACKGROUND

During manufacturing of an array substrate according to existing display technologies, typically a metal shielding layer (SH layer) is formed over a glass substrate, which serves as a light shielding material for an active layer of a thin-film transistor (TFT) in the array substrate, so as to prevent the environmental lights from shining onto the active layer to thus have a negative effect on the characteristics of the TFT.

The above structure has the following problems. First, because the metal shielding layer needs to be electrically connected with a fixed voltage, the parasitic capacitance is easily introduced thereby. Second, a temperature of the metal shielding layer increases after heating, which is equivalent to a high-temperature treatment of the active layer. This has a negative effect on the TFT characteristics. Third, lights inside the display panel can still be reflected by the metal shielding layer and other metal layers, and the reflected lights also have adverse effects on the TFT characteristics.

These above problems are detrimental to the improvement of the resolution of the display panel and the improvement of the characteristics of a backlight display panel.

SUMMARY

In a first aspect, the present disclosure provides an array substrate.

The array substrate comprises a substrate, an active layer, and an amorphous silicon shielding layer. The substrate has a first surface and a second surface, which are opposing to each other. The active layer is disposed over the first surface of the substrate. The amorphous silicon shielding layer comprises a composition of amorphous silicon, and is disposed between the active layer and the substrate, or alternatively is disposed over a side of the substrate proximal to the second surface of the substrate.

The array substrate is configured such that an orthographic projection of the amorphous silicon shielding layer on the first surface at least partially covers an orthographic projection of the active layer on the first surface, such that the amorphous silicon shielding layer shields a light from shedding onto the active layer.

Herein preferably, the orthographic projection of the amorphous silicon shielding layer on the first surface completely covers an orthographic projection of the active layer on the first surface.

According to some embodiments of the array substrate, the orthographic projection of the amorphous silicon shielding layer on the first surface is configured to completely cover the first surface of the substrate.

According to some other embodiments, the array substrate comprises an illuminating region and a non-illuminating region. The orthographic projection of the active layer on the first surface is within the non-illuminating region, and the orthographic projection of the amorphous silicon shielding layer on the first surface covers only the non-illuminating region, but not the illuminating region.

Herein, the array substrate can further comprise a first insulating layer, which is between the amorphous silicon shielding layer and the substrate. Optionally, on this basis, the array substrate can further comprise a second insulating layer, which is over a surface of the amorphous silicon shielding layer distal to the substrate.

In the array substrate described above, the amorphous silicon in the amorphous silicon shielding layer preferably has a number of dangling bonds of at least around $10^{20}$ cm$^{-3}$.

In the array substrate described above, the amorphous silicon shielding layer is over a side of the substrate proximal to the second surface of the substrate, and the array substrate optionally further comprises a buffer layer, which is between the active layer and the first surface of the substrate.

In a second aspect, the present disclosure further provides a display panel, which includes an array substrate according to any one of the embodiments as described above.

According to some embodiments, the display panel is a top-emitting display panel, and the orthographic projection of the amorphous silicon shielding layer on the first surface of the substrate completely covers the first surface of the substrate.

Herein optionally, the display panel can be an OLED display panel.

According to some embodiments, the display panel is a bottom-emitting display panel, and the array substrate comprises an illuminating region and a non-illuminating region. It is configured such that the orthographic projection of the active layer on the first surface is within the non-illuminating region, and the orthographic projection of the amorphous silicon shielding layer on the first surface covers only the non-illuminating region, but not the illuminating region.

Herein optionally, the display panel can be an OLED display panel, or can be a LCD display panel.

In a third aspect, the present disclosure further provides a display apparatus, which includes a display panel according to any one of the embodiments as described above.

In a fourth aspect, the present disclosure further comprises a method for manufacturing an array substrate as described above.

The method comprises the following steps:

providing a substrate having a first surface and a second surface opposingly arranged to each other; and forming an active layer and an amorphous silicon shielding layer comprising amorphous silicon over the substrate, such that the active layer is over the first surface of the substrate, and the amorphous silicon shielding layer is between the active layer and the substrate or over a side of the substrate proximal to the second surface of the substrate, and an orthographic projection of the amorphous silicon shielding layer on the first surface at least partially covers an orthographic projection of the active layer on the first surface.

According to some embodiments of the method, the step of forming an active layer and an amorphous silicon shielding layer comprises a sub-step of:

forming a layer of amorphous silicon to completely cover the substrate.

Further optionally, the step of forming an active layer and an amorphous silicon shielding layer further comprises a sub-step of:

performing an etching process to the layer of amorphous silicon such that a portion of the layer of amorphous silicon corresponding to an illuminating region of the array substrate is removed.

Herein, prior to the sub-step of forming a layer of amorphous silicon to completely cover the substrate, the step of forming an active layer and an amorphous silicon shielding layer further comprises a sub-step of forming a protective layer on a surface of the substrate distal to the layer of amorphous silicon; and after the sub-step of performing an etching process to the layer of amorphous silicon, the step of forming an active layer and an amorphous silicon shielding layer further comprises a sub-step of removing the protective layer from the surface of the substrate.

Herein the protective layer can comprise a metal or a transparent conductive material. Preferably, the protective layer comprises ITO.

According to some embodiments of the method, prior to the sub-step of forming a layer of amorphous silicon to completely cover the substrate, the step of forming an active layer and an amorphous silicon shielding layer further comprises a sub-step of forming a first insulating layer over the substrate, wherein the first insulating layer is arranged to be over a same surface of the substrate as the layer of amorphous silicon. As such, the sub-step of forming a layer of amorphous silicon to completely cover the substrate comprises:

forming the layer of amorphous silicon over a surface of the first insulating layer distal to the substrate.

Herein after the sub-step of performing an etching process to the layer of amorphous silicon, the step of forming an active layer and an amorphous silicon shielding layer can further comprise a sub-step of:

forming a second insulating layer over a surface of the amorphous silicon shielding layer distal to the substrate.

BRIEF DESCRIPTION OF DRAWINGS

In order to clearly illustrate the various embodiments provided in the present disclosure, the following are drawings that accompany the description of the embodiments.

It is noted that these drawings shall be interpreted to serve illustrating purposes only, and that these drawings may represent just some, but not all, of embodiments of the present disclosure. For those skilled in the art, other embodiments that are based on the structures as described below and illustrated in these drawings may become obvious. As such, these other embodiments shall be interpreted to be contained within the scope of the disclosure.

DETAILED DESCRIPTION

Figure 1:
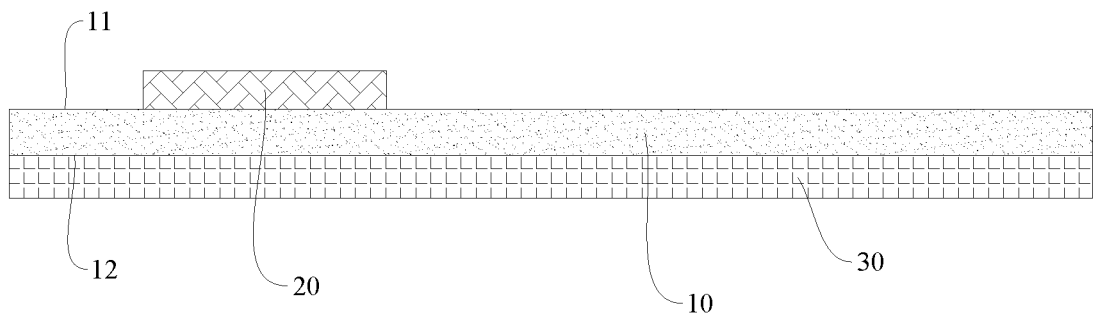
FIG. 1 illustrates a schematic diagram of an array substrate according to some embodiments of the disclosure.

Various embodiments of the present disclosure are described below with specific examples, and other advantages and effects of the present disclosure can be easily understood by those skilled in the field of technology from the contents disclosed in this specification.

Apparently, the described embodiments are only a part of embodiments in the present disclosure, rather than all of them. The present disclosure can also be implemented or applied through different specific embodiments, and various details of the specification can also be modified or changed based on different viewpoints and applications without departing from the spirit of the present disclosure.

In a first aspect, the present disclosure provides an array substrate.

The array substrate comprises a substrate, an active layer, and an amorphous silicon shielding layer. The substrate has a first surface and a second surface, which are opposing to each other. The active layer is disposed over the first surface of the substrate. The amorphous silicon shielding layer comprises a composition of amorphous silicon, and is disposed between the active layer and the substrate, or alternatively is disposed over a side of the substrate proximal to the second surface of the substrate.

The array substrate is configured such that an orthographic projection of the amorphous silicon shielding layer on the first surface at least partially covers an orthographic projection of the active layer on the first surface, such that the amorphous silicon shielding layer shields a light from shedding onto the active layer.

According to some embodiments of the array substrate, the orthographic projection of the amorphous silicon shielding layer on the first surface is configured to completely cover the first surface of the substrate.

According to some other embodiments of the array substrate, the orthographic projection of the amorphous silicon shielding layer on the first surface is configured to cover only a non-illuminating region of the array substrate, but not an illuminating region of the array substrate.

In the following, with reference to the various embodiments of the array substrate and relevant drawings, the structure of the array substrate according to various embodiments is described in detail.

FIGS. 1-4 each illustrates a schematic diagram of an array substrate according to several different embodiments of the disclosure. As shown in these figures, the array substrate includes a substrate 10, an active layer 20, and an amorphous silicon shielding layer 30. The substrate 10 is provided with a first surface 11 and a second surface 12, which are opposing to each other. The active layer 20 is disposed over the first surface 11 of the substrate 10.

Figure 2:
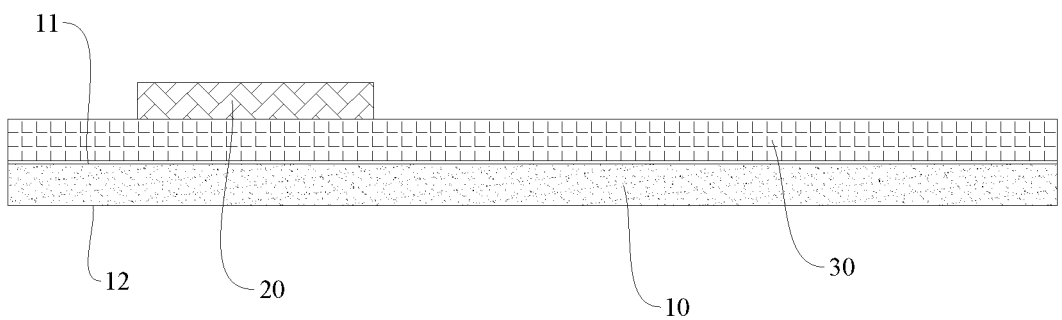
FIG. 2 illustrates a schematic diagram of an array substrate according to some other embodiments of the disclosure.
Figure 3:
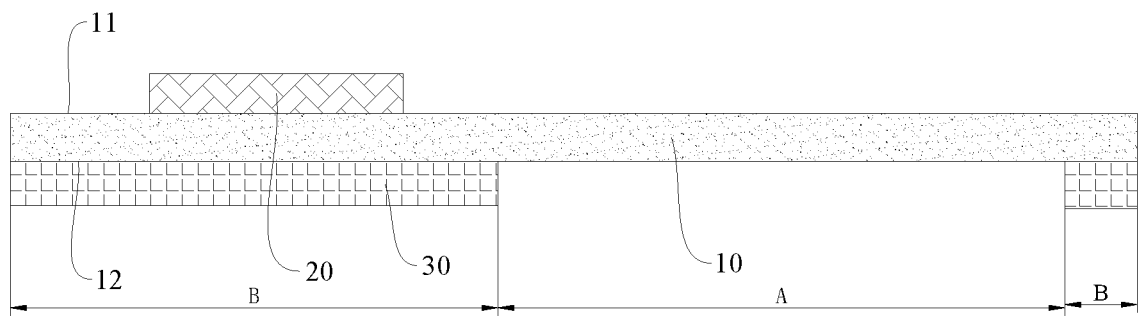
FIG. 3 illustrates a schematic diagram of an array substrate according to yet some other embodiments of the disclosure.
Figure 4:
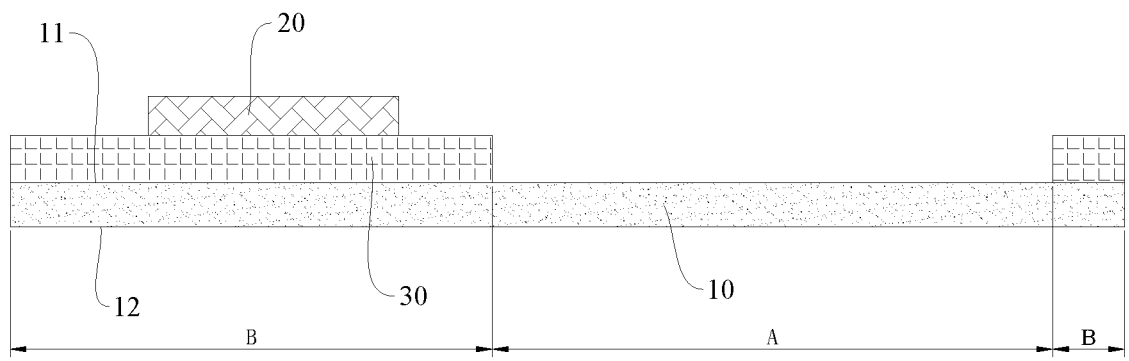
FIG. 4 illustrates a schematic diagram of an array substrate according to yet some embodiments of the disclosure.

The amorphous silicon shielding layer 30 is arranged between the substrate 10 and the active layer 20 (as illustrated in FIG. 2 and FIG. 4), or is disposed over the second surface 12 of the substrate 10 (i.e. the active layer and the amorphous silicon shielding layer 30 are arranged on two opposing surfaces of the substrate 10, as illustrated in FIG. 1 and FIG. 3). It is further configured that an orthographic projection of the amorphous silicon shielding layer 30 on the first surface 11 of the substrate 10 covers the whole first surface 11 (as illustrated in FIG. 1 and FIG. 2), or that the orthographic projection of the amorphous silicon shielding layer 30 on the first surface 11 of the substrate 10 covers a non-illuminating region B, but is not overlapped with an illuminating region A, of the substrate 10 (as illustrated in FIG. 3 and FIG. 4).

In any of the embodiments of the array substrate as described above, the amorphous silicon shielding layer 30 has a composition of amorphous silicon (a-Si). Because the amorphous silicon (a-Si) composition in the amorphous silicon shielding layer 30 can absorb lights within the whole spectrum, thus if used to substitute the metal shielding layer as typically employed in existing display panels, the amorphous silicon shielding layer 30 can not only realize the light shielding effect on the active layer of TFTs, but can also help improve the reliability of TFT characteristics due to the fact that the amorphous silicon shielding layer 30 has no aforementioned issues such as metal reflection, heating, etc.

In addition, unlike the metal shielding layer, the use of the amorphous silicon shielding layer 30 to shield the environmental lights does not involve an electrical connection with a voltage, which can avoid or at least reduce the issue of parasitic capacitance. Additionally, it can lead to an improved aperture ratio of pixels, and can also reduce the difficulty in the manufacturing process, resulting in an improved product yield.

Notably, if disposed on the second surface 12 of the substrate 10 (as illustrated in FIG. 1 and FIG. 3), the amorphous silicon shielding layer 30 can totally avoid the issue of parasitic capacitance in the display panel, which can result in a further improvement of the performance of the driving circuit.

Furthermore, the hydrogen atoms in the amorphous silicon (a-Si) composition of the amorphous silicon shielding layer 30 do not have any effect on the active layer of TFTs in the display panel.

It is noted that in the above embodiments of the array substrate, the amorphous silicon shielding layer 30 is configured to cover the whole surface structure of the substrate 10 (i.e. an orthographic projection of the amorphous silicon shielding layer 30 on the substrate 10 covers the whole surface of the substrate 10, as illustrated in FIG. 1 or FIG. 2), or is configured to match the whole non-illuminating region B but not to overlap with any illuminating region A (i.e. an orthographic projection of the amorphous silicon shielding layer 30 on the substrate 10 covers only the non-illuminating region B but not the illuminating region A, as illustrated in FIG. 3 or FIG. 4), which has a relatively better light shielding effect, in turn leading to an improved performance and reliability of the array substrate.

Herein and throughout the disclosure, the non-illuminating region B is defined as a region of the array substrate which does not emit lights therefrom, and the illuminating region A is defined as a region of the array substrate which emits lights therefrom. The non-illuminating region can include a non-display region or a region corresponding to TFTs (i.e. a region where TFTs are disposed).

It is noted that in the embodiments where the amorphous silicon shielding layer 30 is arranged between the substrate 10 and the active layer 20 (i.e. the amorphous silicon shielding layer 30 is arranged to be in proximity of the active layer 20), such as those illustrated in FIG. 2 or FIG. 4, in order to reduce the effect of hydrogen atoms present in the amorphous silicon composition of the amorphous silicon shielding layer 30 on the active layer 20, measures can be taken in various different embodiments.

One such measure can be by means of reducing the amount of hydrogen atoms in the amorphous silicon composition of the amorphous silicon shielding layer 30, which can be through reducing a content of $H_2$ in the precursors for depositing the amorphous silicon during formation process of the amorphous silicon shielding layer 30. For example, the content of hydrogen gas ($H_2$) in the silane precursors (e.g. $SiH_4$, $Si_2H_6$, etc.) can be controlled to be 10-30% in weight percentage during the formation of the amorphous silicon shielding layer 30.

As such, the negative effects of the hydrogen atoms present in the amorphous silicon composition of the amorphous silicon shielding layer 30 on the active layer 20 can thereby be reduced.

Additionally, the number of defects in the amorphous silicon composition of the amorphous silicon shielding layer 30 can be increased, which can in turn result in an improved absorption of lights of various wavelengths by the amorphous silicon composition of the amorphous silicon shielding layer 30. This above measure is known to people of ordinary skills in the field. Specifically, defects in an amorphous silicon (a-Si) material are primarily caused by the presence of dangling bonds within the a-Si material, and a number of the dangling bonds in the a-Si material directly reflects the contents of the defects in the same material. Typically, the higher the number of dangling bonds, the higher the number of defects. In the a-Si material, the presence of hydrogen atoms, which are commonly introduced by doping, can reduce the number of dangling bonds to around $10^{15}$-$10^{16}$ cm$^{-3}$. In the disclosure herein, the amorphous silicon shielding layer 30 can be controlled to have a reduced hydrogen doping, such that the number of dangling bonds can reach at least around $10^{20}$ cm$^{-3}$. As such, the amorphous silicon shielding layer 30 have a relatively high number of defects to thereby improve the light absorption by the amorphous silicon composition of the amorphous silicon shielding layer 30.

According to some embodiments where the array substrate is utilized in a top-emitting display panel, the amorphous silicon shielding layer 30 can be disposed over the whole first surface 11 or disposed over the whole second surface 12 of the substrate 10 without the need for patterning. In other words, in the array substrate for a top-emitting display panel, the amorphous silicon shielding layer 30 can be configured such that its orthographic projection on the first surface 11 of the substrate 10 covers the whole first surface 11, or that its orthographic projection on the second surface 12 of the substrate 10 covers the whole second surface 12. These embodiments of the array substrate are illustrated in each of FIGS. 1, 2, and 5-6.

It is understandable by people of ordinary skills in the field that the embodiments of the array substrate where an orthographic projection of the amorphous silicon shielding layer 30 on the first surface 11 of the substrate 10 covers only a non-illuminating region B, but not an illuminating region A, of the substrate 10, such as those illustrated in FIGS. 3-4, can also be employed in a top-emitting display panel.

Yet during a manufacturing process of a top-emitting display panel containing these above embodiments of the array substrate as illustrated in FIG. 3 or FIG. 4, the amorphous silicon shielding layer 30 can be first formed on the whole first surface 11 or on the whole second surface 12 of the substrate 10, followed by an etching process to remove the portion of the amorphous silicon shielding layer 30 corresponding to the illuminating region A.

As such, with a consideration of simplifying the manufacturing process of the top-emitting display panel, preferably the amorphous silicon shielding layer 30 is formed on the whole first surface 11 or on the whole second surface 12 of the substrate 10, as illustrated in each of FIGS. 1, 2, and 5-6.

In the specific embodiments of the array substrate as illustrated in FIG. 2, the amorphous silicon shielding layer 30 is arranged over the first surface 11 of the substrate 10, the active layer 20 is arranged over a surface of the amorphous silicon shielding layer 30 that is distal to the substrate 10, and it is configured such that an orthographic projection of the amorphous silicon shielding layer 30 on the first surface 11 covers the whole first surface 11.

As such, in the above embodiments of the array substrate illustrated in FIG. 2, the amorphous silicon shielding layer 30 substitutes a metal shielding layer conventionally employed in an existing array substrate, which can realize the light-shielding effect on the active layer 20 of a TFT, and can further avoid the problems such as metal reflection, and heating, etc., to thereby result in an improved reliability of the TFTs.

In addition, due to the fact that the amorphous silicon composition of the amorphous silicon shielding layer 30 is a semiconductor material, the issue of parasitic capacitance can be minimized, the aperture ratio of pixel regions can be improved, and the difficulty in the manufacturing process can also be reduced, leading to an improved product yield.

Importantly, because in these embodiments of the array substrate, the orthographic projection of the amorphous silicon shielding layer 30 on the first surface 11 of the substrate 10 covers the whole first surface 11, the lights inside the display panel can be completely shaded/shielded by the amorphous silicon shielding layer 30, thereby resulting in a maximal light shielding effect without any influence on the resolution of the display panel.

It is further noted that in a conventional array substrate, a buffer layer is commonly arranged between the metal shielding layer and the active layer so as to ensure a relatively good working performance of the TFTs. Yet in the embodiments of the array substrate described herein and illustrated in FIG. 2, there is no need for arranging a buffer layer between the amorphous silicon shielding layer 30 and the active layer 20, because the amorphous silicon shielding layer 30 can, in addition to the light-shielding function, also serve the function of a buffer layer.

In the specific embodiments of the array substrate as illustrated in FIG. 1, the amorphous silicon shielding layer 30 is arranged over the second surface 12 of the substrate 10, the active layer 20 is arranged on the first surface 11 of the substrate 10, and it is configured such that an orthographic projection of the amorphous silicon shielding layer 30 on the first surface 11 covers the whole first surface 11.

Similar to the embodiments of the array substrate shown in FIG. 2, in the above embodiments of the array substrate illustrated in FIG. 1, the amorphous silicon shielding layer 30 can substitute the conventional metal shielding layer to realize the light-shielding effect on the active layer of a TFT, and can further avoid the problems such as metal reflection, and heating, etc. Because the amorphous silicon shielding layer 30 is disposed on the second surface 12 of the substrate 10, there is also no requirement for electrical connection with a voltage. Additionally, the issue of parasitic capacitance can be totally avoided, the aperture ratio of pixel regions can be improved, and the difficulty in the manufacturing process can also be reduced.

Importantly, because the active layer 20 and the amorphous silicon shielding layer 30 are separately arranged on two opposing surfaces (i.e. the first surface 11 and the second surface 12) of the substrate 10, the hydrogen atoms in the amorphous silicon composition of the amorphous silicon shielding layer 30 have no influence on the active layer 20.

It is further noted that because in both embodiments of the array substrate as illustrated in FIG. 1 and in FIG. 2, the orthographic projection of the amorphous silicon shielding layer 30 on the first surface 11 of the substrate 10 covers the whole first surface 11, the lights inside a display panel that contains either embodiment of the array substrate can be completely shielded by the amorphous silicon shielding layer 30, thereby resulting in a maximal light-shielding effect without any influence on the resolution of the display panel.

Figure 5:
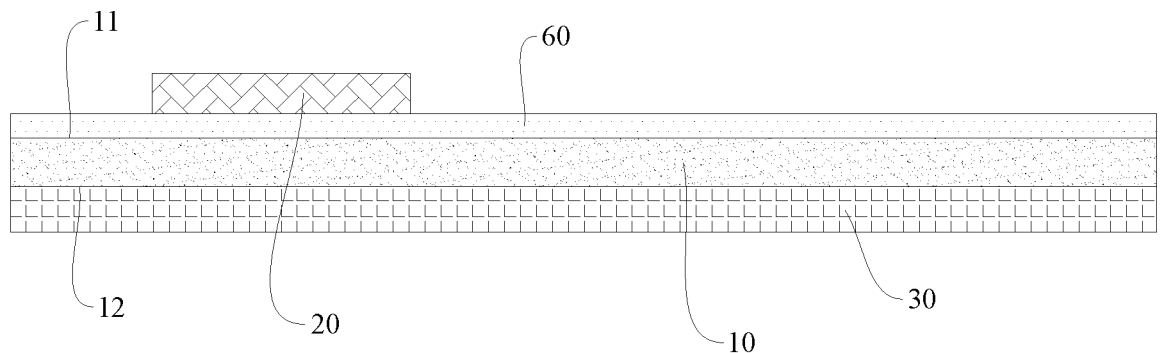
FIG. 5 shows a schematic diagram of an array substrate provided with a buffer layer according to some embodiments of the disclosure.

It is noted that in order to better ensure the performances of the TFTs, a buffer layer 60 can be additionally arranged between the active layer 20 and the first surface 11 of the substrate 10 in the embodiments of the array substrate as illustrated in FIG. 1, to thereby obtain the embodiments of the array substrate as illustrated in FIG. 5.

Figure 6:
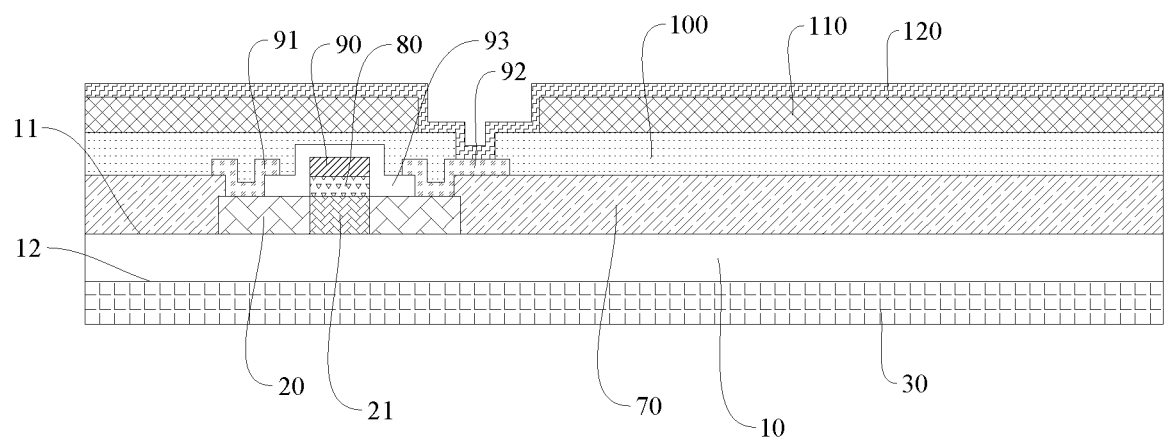
FIG. 6 illustrates an array substrate according to one specific embodiment of the disclosure.

FIG. 6 illustrates an array substrate according to one specific embodiment of the disclosure. As shown in FIG. 6, the amorphous silicon shielding layer 30 is disposed over the second surface 12 of the substrate 10, and the active layer 20 is disposed over the first surface 11 of the substrate 10. A channel region of the active layer 20 is doped to thereby form a channel 21.

As further shown in FIG. 6, a third insulating layer 70 is arranged on the first surface 11. A fourth insulating layer 80 is arranged on a surface of the channel 21 that is distal to the substrate 10, and it is configured such that an orthographic projection of the fourth insulating layer 80 on the substrate 10 overlaps with an orthographic projection of the channel 21 on the substrate 10.

A gate electrode 90 is arranged on a surface of the fourth insulating layer 80 that is distal to the substrate 10, and it is configured such that an orthographic projection of the fourth insulating layer 80 on the substrate 10 overlaps with an orthographic projection of the gate electrode 90 on the substrate 10. A fifth insulating layer 93 is arranged on a surface of the gate electrode 90 that is distal to the substrate 10, and the fifth insulating layer 93 is configured to cover the fourth insulating layer 80 and to partially cover the active layer 20.

A source electrode 91 and a drain electrode 92 are respectively coupled/connected electrically with the active layer 20 electrically through a via. A sixth insulating layer 100 is arranged on a surface of the third insulating layer 70 that is distal to the substrate 10, and the sixth insulating layer 100 is configured to cover the source electrode 91, the drain electrode 92, and the fifth insulating layer 93. A seventh insulating layer 110 is arranged on a surface of the sixth insulating layer 100 that is distal to the substrate 10. An electrode 120 is arranged on a surface of the seventh insulating layer 110 that is distal to the substrate 10, and the electrode 120 is electrically coupled/connected to the drain electrode 92 through a via in the sixth insulating layer 100 and in the seventh insulating layer 110.

According to some embodiments where the array substrate is utilized for a bottom-emitting display panel, the amorphous silicon shielding layer 30 is configured such that its orthographic projection on the first surface 11 or on the second surface 12 of the substrate 10 covers only the non-illuminating region B, but not the illuminating region A, of the substrate 10, as illustrated in FIG. 3 or FIG. 4.

During manufacturing of the amorphous silicon shielding layer 30 in these embodiments of the array substrate, a whole layer of amorphous silicon can be first deposited on the whole first surface 11 or the whole second surface 12 of the substrate 10, and an etching process can then be applied to remove the portion of the layer of amorphous silicon corresponding to the illuminating region A, while the portion of the layer of amorphous silicon corresponding to the non-illuminating region B is left unaffected.

Figure 7:
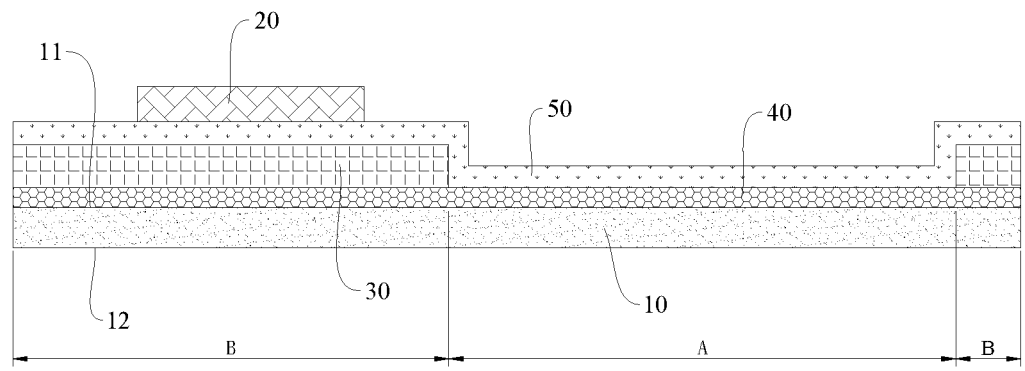
FIG. 7 illustrates an array substrate according to one specific embodiment of the disclosure.
Figure 8:
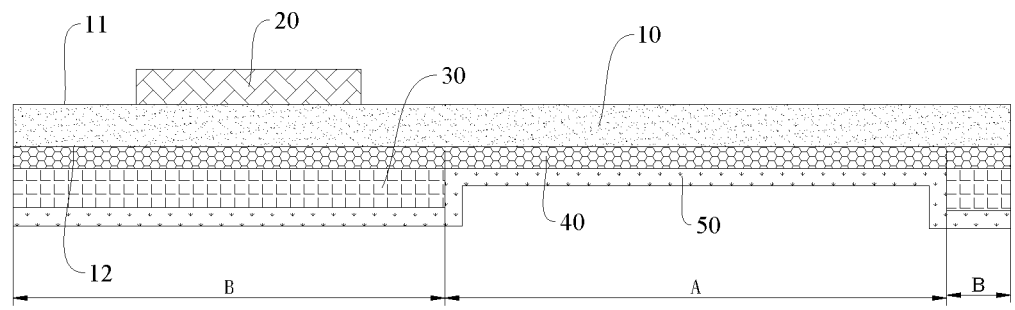
FIG. 8 illustrates an array substrate according to another specific embodiment of the disclosure.

In order to prevent a damage to the substrate 10 in the above etching process, the array substrate further comprises a first insulating layer 40 and a second insulating layer 50. The first insulating layer 40 is arranged between the amorphous silicon shielding layer 30 and the substrate 10, and the second insulating layer 50 is arranged on a surface of the amorphous silicon shielding layer 30 that is distal to the substrate 10, as illustrated in FIG. 7 and FIG. 8. As such, in these embodiments of the array substrate, damages to the substrate 10 during etching process to thereby form the amorphous silicon shielding layer 30 of the array substrate can be effectively avoided.

FIG. 7 illustrates an array substrate according to one specific embodiment of the disclosure. As shown in FIG. 7, the first insulating layer 40 is arranged on the first surface 11 of the substrate 10, the amorphous silicon shielding layer 30 is disposed on a surface of the first insulating layer 40 that is distal to the substrate 10, the second insulating layer 50 is disposed on a surface of the amorphous silicon shielding layer 30 that is distal to the substrate 10, and the active layer 20 is disposed on a surface of the second insulating layer 50 that is distal to the substrate 10. It is configured such that an orthographic projection of the amorphous silicon shielding layer 30 on the first surface 11 of the substrate 10 covers only the non-illuminating region B, but not the illuminating region A.

FIG. 8 illustrates an array substrate according to another specific embodiment of the disclosure. As shown in FIG. 8, the first insulating layer 40 is arranged on the second surface 12 of the substrate 10, the amorphous silicon shielding layer 30 is disposed on a surface of the first insulating layer 40 that is distal to the substrate 10, the second insulating layer 50 is disposed on a surface of the amorphous silicon shielding layer 30 that is distal to the substrate 10, and the active layer 20 is disposed on the first surface 11 of the substrate 10. It is configured such that an orthographic projection of the amorphous silicon shielding layer 30 on the first surface 11 of the substrate 10 covers only the non-illuminating region B, but not the illuminating region A.

Figure 9:
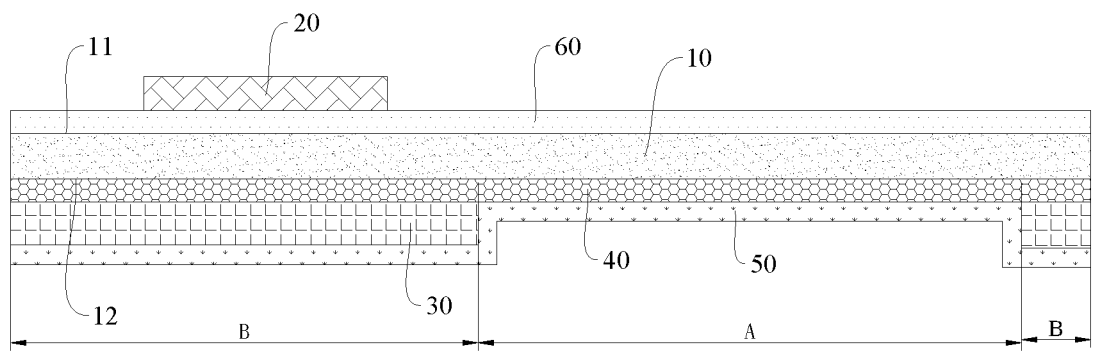
FIG. 9 illustrates an array substrate having a buffer layer additionally configured in the embodiment of the array substrate as illustrated in FIG. 8.

It is noted that in order to further ensure that the TFT characteristics is not influenced, based on the embodiments of the array substrate as illustrated in FIG. 8, a buffer layer 60 can be arranged between the active layer 20 and the first surface 11 of the substrate 10 to thereby obtain an embodiment of the array substrate as illustrated in FIG. 9.

Figure 10:
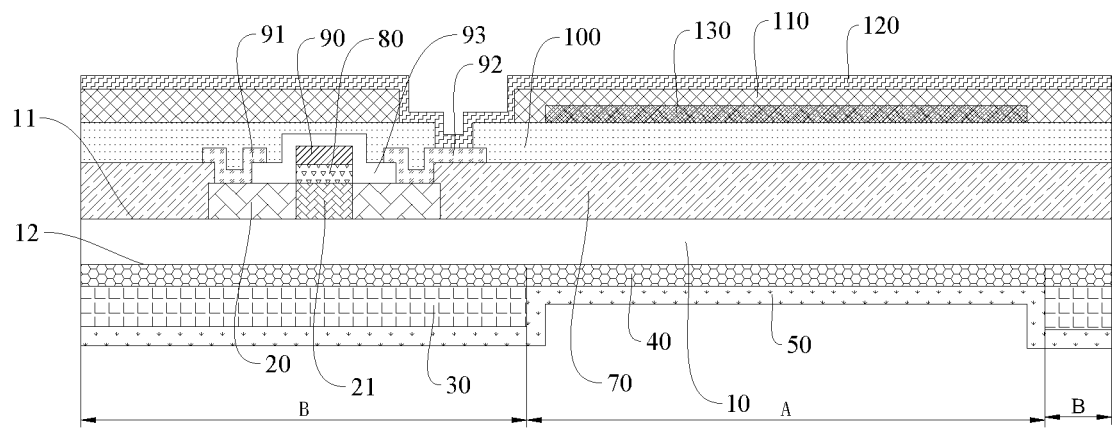
FIG. 10 illustrates an array substrate according to one specific embodiment of the disclosure.

FIG. 10 illustrates an array substrate according to one specific embodiment of the disclosure. In this specific embodiment of the array substrate as shown in FIG. 10, the first insulating layer 40 is arranged on the second surface 12 of the substrate 10, the amorphous silicon shielding layer 30 is disposed on a surface of the first insulating layer 40 that is distal to the substrate 10, the second insulating layer 50 is disposed on a surface of the amorphous silicon shielding layer 30 that is distal to the substrate 10, and the active layer 20 is disposed on the first surface 11 of the substrate 10.

It is configured such that an orthographic projection of the amorphous silicon shielding layer 30 on the first surface 11 of the substrate 10 covers only the non-illuminating region B, but not the illuminating region A. A channel region of the active layer 20 is doped to thereby form a channel 21.

A third insulating layer 70 is arranged on the first surface 11 of the substrate 10. A fourth insulating layer 80 is arranged on a surface of the channel 21 that is distal to the substrate 10, and it is configured such that an orthographic projection of the fourth insulating layer 80 on the substrate 10 overlaps with an orthographic projection of the channel 21 on the substrate 10.

A gate electrode 90 is arranged on a surface of the fourth insulating layer 80 that is distal to the substrate 10, and it is configured such that an orthographic projection of the fourth insulating layer 80 on the substrate 10 overlaps with an orthographic projection of the gate electrode 90 on the substrate 10. A fifth insulating layer 93 is arranged on a surface of the gate electrode 90 that is distal to the substrate 10, and the fifth insulating layer 93 is configured to cover the fourth insulating layer 80 and to partially cover the active layer 20.

A source electrode 91 and a drain electrode 92 are respectively connected electrically with the active layer 20 through a via. A sixth insulating layer 100 is arranged on a surface of the third insulating layer 70 that is distal to the substrate 10, and the sixth insulating layer 100 is configured to cover the source electrode 91, the drain electrode 92, and the fifth insulating layer 93.

A color filter 130 is arranged on a surface of the sixth insulating layer 100 that is distal to the substrate 10, and it is configured such that an orthographic projection of the color filter 130 on the substrate 10 covers the illuminating region A.

A seventh insulating layer 110 is arranged on a surface of the sixth insulating layer 100 that is distal to the substrate 10, and is further configured to cover the color filter 130. An electrode 120 is arranged on a surface of the seventh insulating layer 110 that is distal to the substrate 10, and the electrode 120 is electrically connected to the drain electrode 92 through a via in the seventh insulating layer 110.

The following are noted for any of the embodiments of the array substrate described above and illustrated in FIGS. 1-10.

First, there is no specific limitation to the type of the substrate 10, which can be a glass substrate, a polymer substrate, or of other types.

Second, there is also no specific limitation to the compositions of the active layer 20, which can be an oxide, a silicon material, an organic material, etc. Examples of the composition for the active layer in the disclosure can include, but not limited to, amorphous indium gallium zinc oxide (a-IGZO), N-doped zinc oxide (ZnON), indium zinc tin oxide (IZTO), amorphous silicon (a-Si), polycrystalline silicon (p-Si), sexithiophene, or polythiothioate, etc. An active layer 20 of any composition can be applied in the array substrate disclosed herein.

Third, the compositions of, and the arrangements for, the amorphous silicon shielding layer 30 as illustrated above can be suitable for forming the active layer of a TFT of any structures. Examples can include: TFTs of a top-gate structure (such as those illustrated in FIGS. 2-5), TFTs of a bottom-gate structure (not shown in the drawings), TFTs of a back channel etched (BCE) structure, and TFTs of an etching barrier (ESL) structure, etc.

Fourth, there is no limitation to the composition for each of the insulating layers mentioned above in the various embodiments of the array substrate including the first insulating layer 40, the second insulating layer 50, the third insulating layer 70, the fourth insulating layer 80, the fifth insulating layer 93, the sixth insulating layer 100, and the seventh insulating layer 110, as well as the buffer layer 60. Herein, the composition can be a dielectric material such as silicon oxide (SiOx), silicon nitride (SiNx), silicon oxynitride (SiON), etc. The composition can also be an organic insulating material such as polysiloxane, acrylic, or polyimide, etc. The composition can also be a high-permittivity material such as alumina (AlOx), hafnium oxide (HfOx), tantalum oxide (TaOx), etc.

Fifth, there is no limitation to the composition for the source electrode 91, the drain electrode 92, or the electrode 120. Examples of the composition can include a metal, such as Ag, Cu, Al, or Mo, etc., an alloy such as AlNd, or MoNb, etc., a multi-layer metal structure such as MoNb/Cu/MoNb, a transparent and conductive metal oxide such as ITO, or AZO, etc., or a multiplex structure such as ITO/Ag/ITO.

In a second aspect, the disclosure further provides a display panel.

The display panel includes an array substrate according to any one of the embodiments as described above. Because of the advantages described above for the array substrate, the display panel also has advantages including a high aperture ratio, a high resolution, and being relatively easy to manufacture.

According to some embodiments, the display panel can be a top-emitting display panel, such as a top-emitting OLED (organic light-emitting light diode) display panel. The display panel can specifically include an array substrate according to the embodiments as illustrated in any one of FIGS. 1-2 and 5-6, where the amorphous silicon shielding layer 30 is configured such that its orthographic projection on the first surface 11 of the substrate 10 cover the whole first surface 11.

It is also noted that a top-emitting display panel can also include an array substrate according to the embodiments as illustrated in any one of FIGS. 3-4 and 7-10, where the amorphous silicon shielding layer 30 is configured such that its orthographic projection on the first surface 11 of the substrate 10 covers only the non-illuminating region B, but not the illuminating region A.

According to some embodiments, the display panel can be a bottom-emitting OLED display panel or a LCD display panel. In these embodiments, the display panel can specifically include an array substrate according to the embodiments as illustrated in FIGS. 3-4 and FIGS. 7-10, where the amorphous silicon shielding layer 30 is configured such that its orthographic projection on the first surface 11 of the substrate 10 covers only the non-illuminating region B, but not the illuminating region A.

The display panel disclosed herein has a relatively high aperture ratio and resolution, a relative good working performance and working life, and enjoys a relatively low difficulty in its manufacturing.

It is noted that in addition to the array substrate, the display panel disclosed herein also includes a color film substrate, liquid crystal layer or an OLED light-emitting layer, etc., which are well-known to those of ordinary skills in the field.

In a third aspect, the disclosure further provides a display apparatus, which includes a display panel according to any one of the embodiments as described above.

Herein the display apparatus can be any equipment, device that has a display functionality. Examples of the display apparatus include, but are not limited to, a cellular phone, a tablet, a computer monitor, a game console, a television, a display panel, a wearable device, or any household appliance having display panels.

In a fourth aspect, the disclosure further provides a method for manufacturing an array substrate.

Figure 11A:
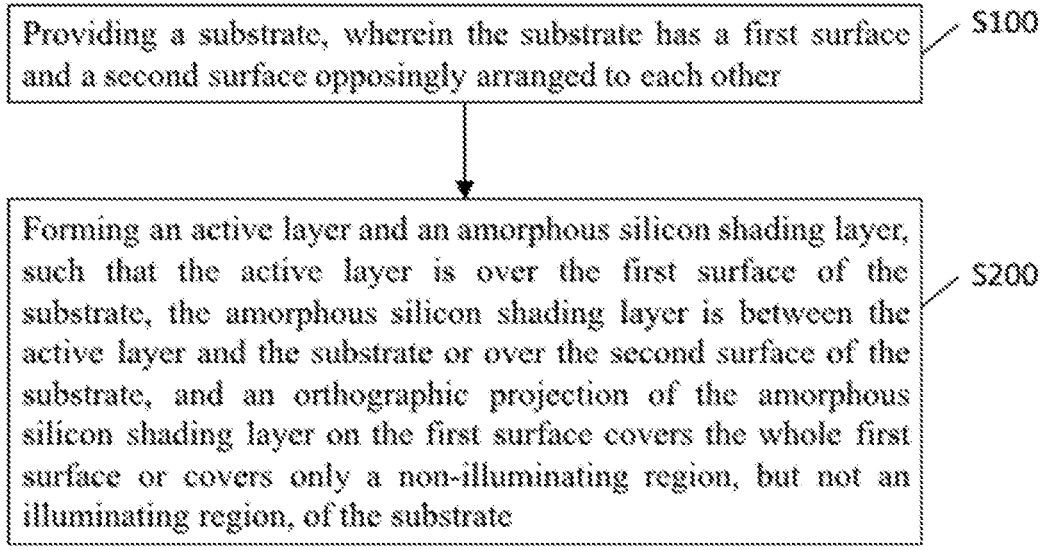
FIG. 11A illustrates a flow chart of a method for manufacturing an array substrate according to some embodiments of the disclosure.

With reference to FIG. 11A, the method includes the following steps.

S100: Providing a substrate, wherein the substrate has a first surface and a second surface opposingly arranged to each other;

S200: Forming an active layer and an amorphous silicon shielding layer, wherein the active layer is over the first surface of the substrate, the amorphous silicon shielding layer is between the active layer and the substrate or over the second surface of the substrate, and an orthographic projection of the amorphous silicon shielding layer on the first surface covers the whole first surface or covers only a non-illuminating region, but not an illuminating region, of the substrate.

Figure 11B:
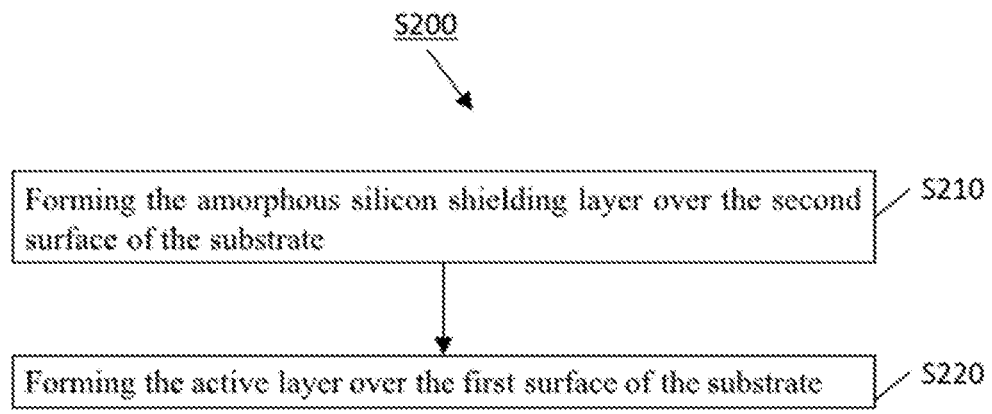
FIG. 11B illustrates a flow chart of the step S200 of the method as illustrated in FIG. 11A according to some embodiments of the disclosure.

According to some embodiments, the amorphous silicon shielding layer and the active layer are respectively on two opposing surfaces of the substrate (such as the embodiment of the array substrate illustrated in FIG. 1), and thus as illustrated in FIG. 11B, step S200 of the method comprises the following sub-steps:

S210: Forming the amorphous silicon shielding layer over the second surface of the substrate; and S220: Forming the active layer over the first surface of the substrate.

It is noted that the order of the sub-steps S210' and S220' can be reversed according to some other embodiments of the method.

Figure 11C:
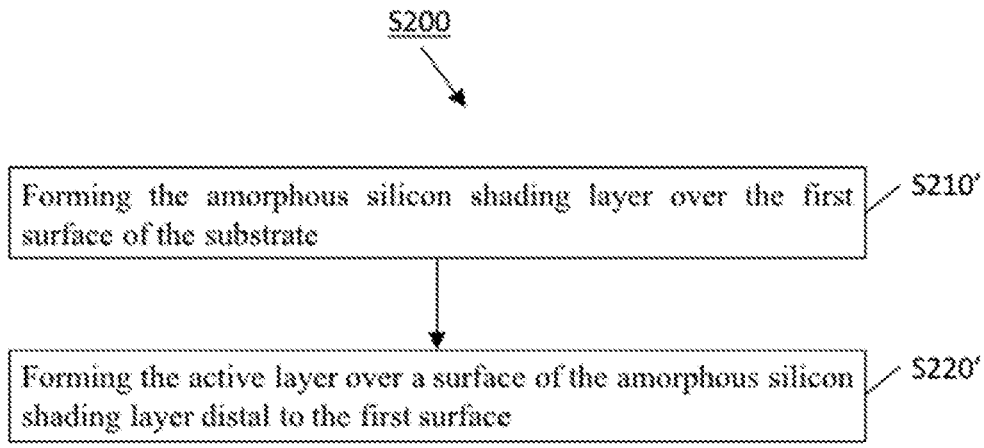
FIG. 11C illustrates a flow chart of the step S200 of the method as illustrated in FIG. 11A according to some other embodiments of the disclosure.

According to yet some other embodiments of the disclosure, the amorphous silicon shielding layer is between the active layer and the substrate (such as the embodiment of the array substrate illustrated in FIG. 2), and thus as illustrated in FIG. 11C, step S200 of the method comprises the following sub-steps:

S210': Forming the amorphous silicon shielding layer over the first surface of the substrate;

S220': Forming the active layer over a surface of the amorphous silicon shielding layer distal to the first surface.

According to some embodiments, the amorphous silicon shielding layer is configured such that its orthographic projection on the first surface covers only a non-illuminating region, but not an illuminating region, of the substrate. The formation of the amorphous silicon shielding layer, regardless of on the first surface or on the second surface of the substrate, substantially comprises a first step of forming a layer of amorphous silicon, and a second step of removing a portion of the layer of amorphous silicon corresponding to the illuminating region.

Figure 11D:
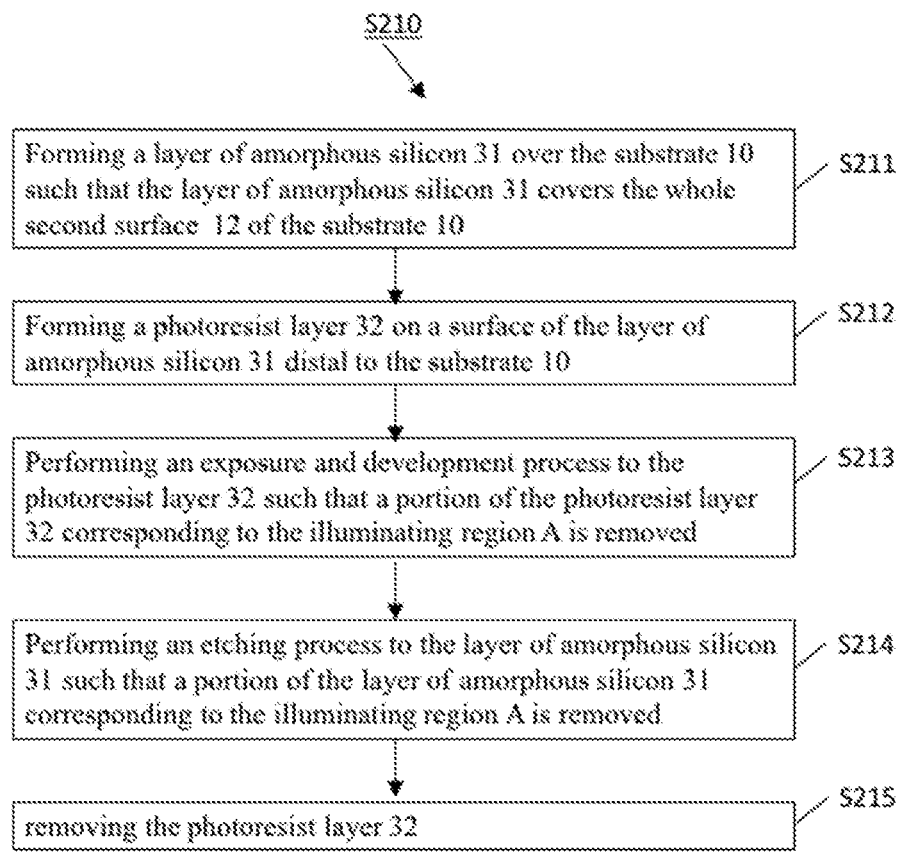
FIG. 11D illustrates a flow chart of the formation of the amorphous silicon shielding layer in the method for manufacturing an array substrate according to some embodiments of the disclosure.

FIG. 11D illustrates a flow chart of the formation of the amorphous silicon shielding layer in the method for manufacturing an array substrate according to some embodiments of the disclosure, where the amorphous silicon shielding layer is formed on the second surface of the substrate.

As shown in FIG. 11D, the sub-step of forming the amorphous silicon shielding layer over the second surface of the substrate (i.e. the sub-step S210 as described above and illustrated in FIG. 11B) in the manufacturing method comprises the following sub-steps S211-S215, and an intermediate product after each of these sub-steps is illustrated in FIGS. 12-16.

S211: Forming a layer of amorphous silicon 31 over the substrate 10 such that the layer of amorphous silicon 31 covers the whole second surface 12 of the substrate 10 (the intermediate product illustrated in FIG. 12);

S212: Forming a photoresist layer 32 on a surface of the layer of amorphous silicon 31 distal to the substrate 10 (the intermediate product illustrated in FIG. 13);

Herein the sub-step S212 can be realized by performing a chemical vapor deposition process, such as PECVD, or performing a physical vapor deposition process.

S213: Performing an exposure and development process to the photoresist layer 32 such that a portion of the photoresist layer 32 corresponding to the illuminating region A is removed (the intermediate product illustrated in FIG. 14);

S214: Performing an etching process to the layer of amorphous silicon 31 such that a portion of the layer of amorphous silicon 31 corresponding to the illuminating region A is removed (the intermediate product illustrated in FIG. 15);

Herein the etching process of the sub-step S214 can be a dry etching process or a wet etching process.

S215: Removing the photoresist layer 32 (the intermediate product illustrated in FIG. 16).

It is noted that the specific flow chart for forming the amorphous silicon shielding layer on the second surface of the substrate as described above and illustrated in FIG. 11D serves only as an illustrating example, and a substantially similar flow chart for forming the amorphous silicon shielding layer on the first surface of the substrate can be applied, and will be skipped herein.

In some embodiments of the array substrate where an orthographic projection of the amorphous silicon shielding layer on the first surface of the substrate covers only a non-illuminating region of the substrate but does not cover an illuminating region, the array substrate further comprises a first insulating layer 40 and a second insulating layer 50, as illustrated in FIG. 7 and FIG. 8, which are purported to prevent a damage to the substrate in an etching process to remove the portion of the layer of amorphous silicon 31 corresponding to the illuminating region A to thereby form the pattern of the amorphous silicon shielding layer 30.

Accordingly, the method additionally includes a sub-step of forming the first insulating layer 40 prior to the formation of the pattern of the amorphous silicon shielding layer 30, and a sub-step of forming the second insulating layer 50 after the formation of the pattern of the amorphous silicon shielding layer 30.

Figure 11E:
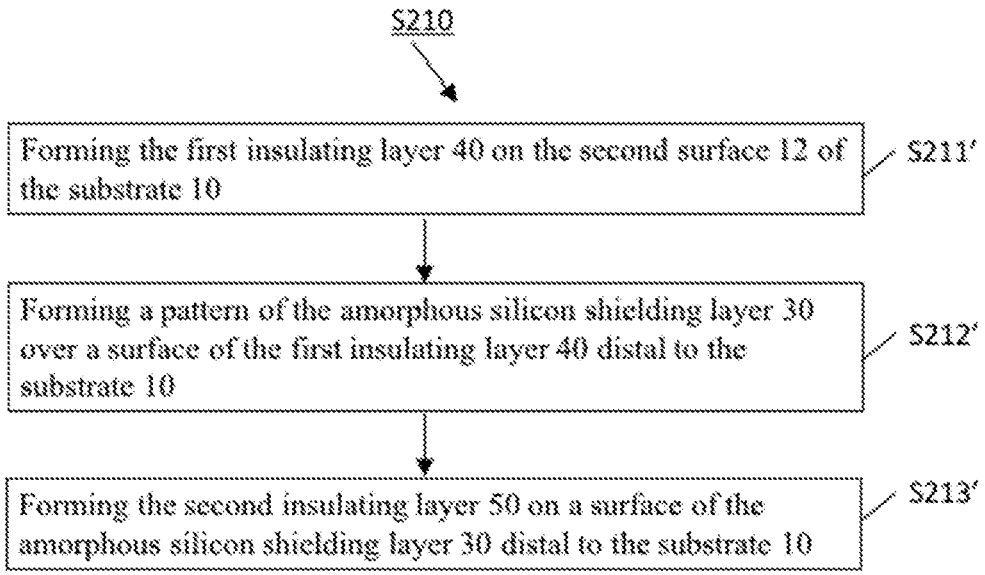
FIG. 11E illustrates a flow chart of the formation of the amorphous silicon shielding layer in the method for manufacturing an array substrate according to some other embodiments of the disclosure.
Figure 17:
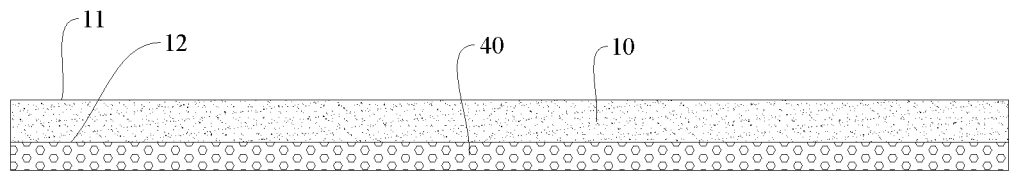
FIGS. 17-19 respectively illustrate an intermediate product after each of these sub-steps S211'-213' as illustrated in FIG. 11E.
Figure 18:
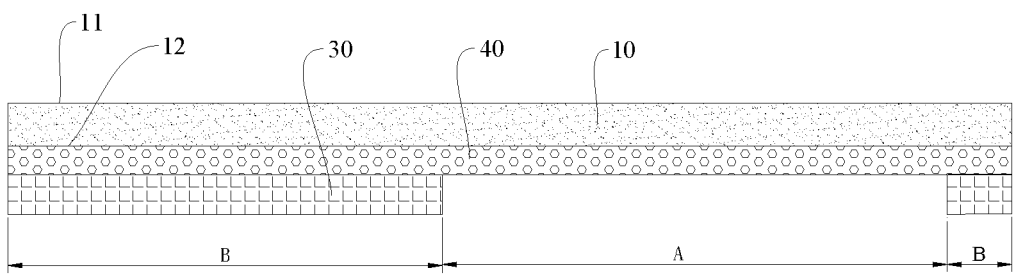
Figure 19:
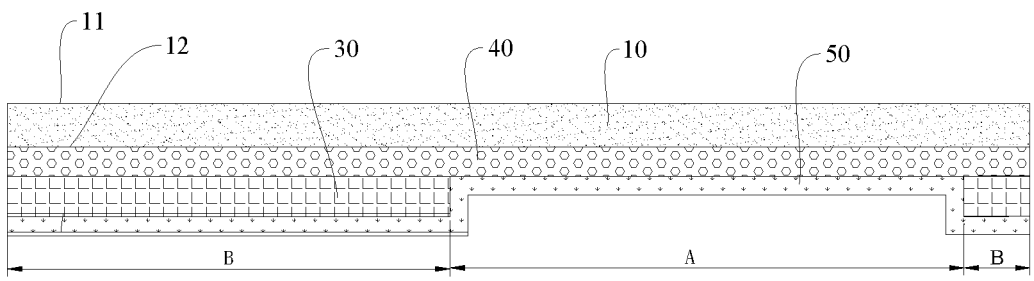

Take the embodiments of the array substrate where the first insulating layer 40 is arranged on the second surface 12 of the substrate 10 as an illustrating example. As illustrated in FIG. 11E, the sub-step of forming the amorphous silicon shielding layer over the second surface of the substrate (i.e. the sub-step S210 as described above and illustrated in FIG. 11B) in the manufacturing method comprises the following sub-steps S211'-S213', and an intermediate product after each of these sub-steps is illustrated in FIGS. 17-19.

S211': Forming the first insulating layer 40 on the second surface 12 of the substrate 10 (the intermediate product illustrated in FIG. 17);

S212': Forming a pattern of the amorphous silicon shielding layer 30 over a surface of the first insulating layer 40 distal to the substrate 10 (the intermediate product illustrated in FIG. 18);

S213': Forming the second insulating layer 50 over a surface of the amorphous silicon shielding layer 30 distal to the substrate 10 (the intermediate product illustrated in FIG. 19).

It is noted that the specific flow chart for forming the amorphous silicon shielding layer on the second surface of the substrate as described above and illustrated in FIG. 11E serves only as an illustrating example, and a substantially similar flow chart for forming the amorphous silicon shielding layer on the first surface 11 of the substrate 10 can be applied, and will be skipped herein.

In order to prevent the deposition process and/or the subsequent etching process in the formation of the amorphous silicon shielding layer 30 on one surface (i.e. the first surface 11 or the second surface 12) of the substrate 10 from damaging the opposing surface (i.e. the second surface 12 or the first surface 11) of the substrate 10, such as causing scratches thereon, according to some embodiments of the disclosure, the method comprises a step of forming a protective layer 140 on the opposing surface of the substrate 10 before forming the amorphous silicon shielding layer 30 on the one surface of the substrate 10, and another step of removing the protective layer 140 from the opposing surface of the substrate 10 after forming the amorphous silicon shielding layer 30 on the one surface of the substrate 10.

Figure 11F:
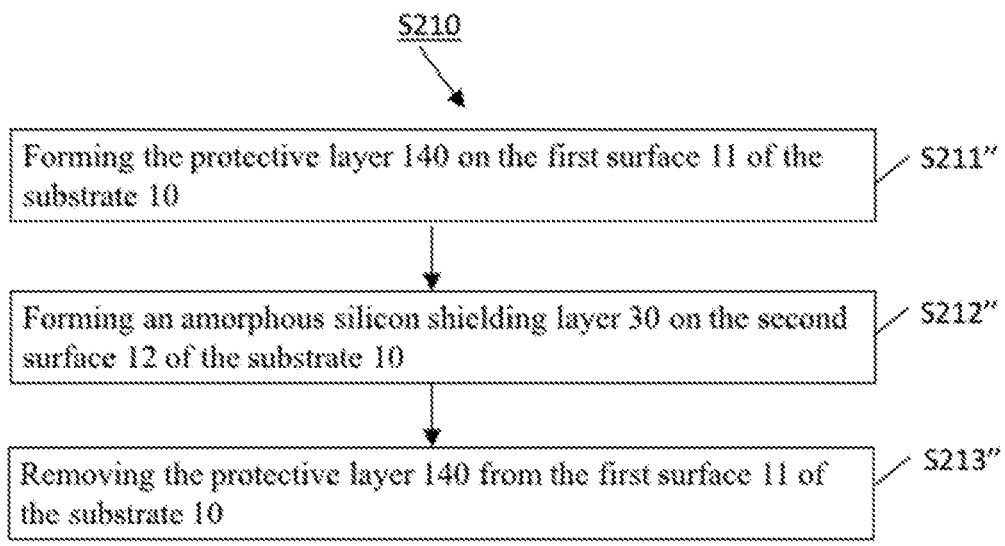
FIG. 11F illustrates a flow chart of the formation of the amorphous silicon shielding layer involving the formation and subsequent removal of a protective layer in the method for manufacturing an array substrate according to some embodiments of the disclosure.
Figure 20:
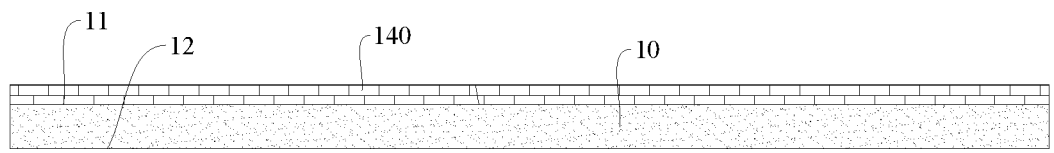
FIGS. 20-22 respectively illustrate an intermediate product after each of these sub-steps S211"-213" as illustrated in FIG. 11F.
Figure 21:
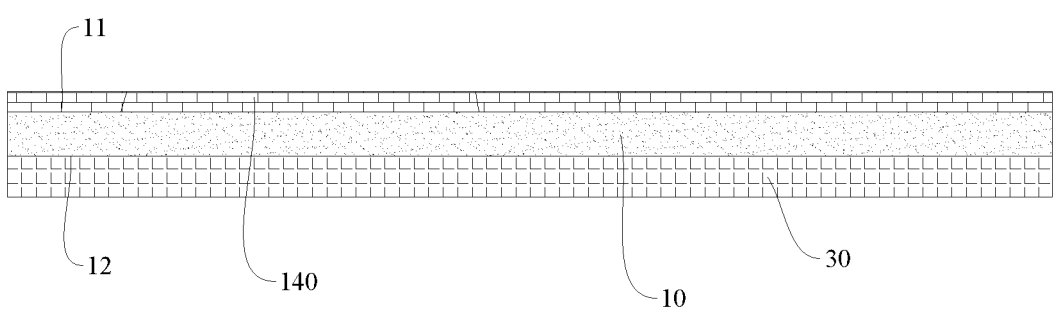
Figure 22:
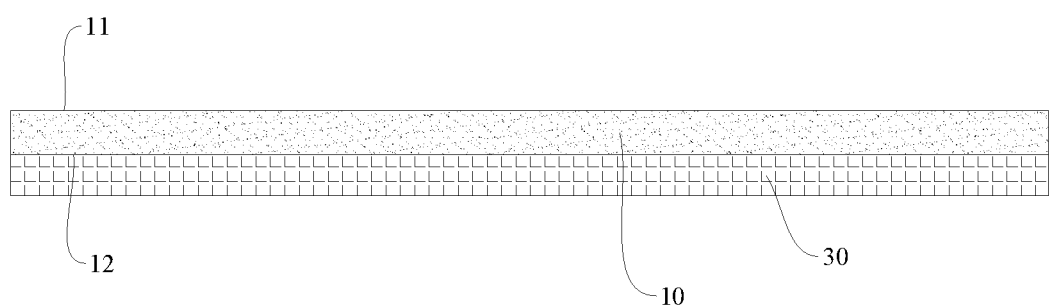

Take the embodiment of the array substrate where the amorphous silicon shielding layer 30 is formed on the whole second surface 12 of the substrate 10 as an illustrating example. As illustrated in FIG. 11F, the sub-step of forming the amorphous silicon shielding layer over the second surface of the substrate (i.e. the sub-step S210 as described above and illustrated in FIG. 11B) in the manufacturing method comprises the following sub-steps S211"-S213", and an intermediate product after each of these sub-steps is illustrated in FIGS. 20-22.

S211": Forming the protective layer 140 on the first surface 11 of the substrate 10 (the intermediate product illustrated in FIG. 20);

S212": Forming an amorphous silicon shielding layer 30 on the second surface 12 of the substrate 10 (the intermediate product illustrated in FIG. 21); and S213": Removing the protective layer 140 from the first surface 11 of the substrate 10 (the intermediate product illustrated in FIG. 22).

Herein the sub-step S212" can include the formation of a layer of amorphous silicon 31 and a subsequent etching process to form the amorphous silicon shielding layer 30.

Then after the sub-step S213" the step S220 of forming the active layer over the first surface of the substrate can be performed.

Figure 11G:
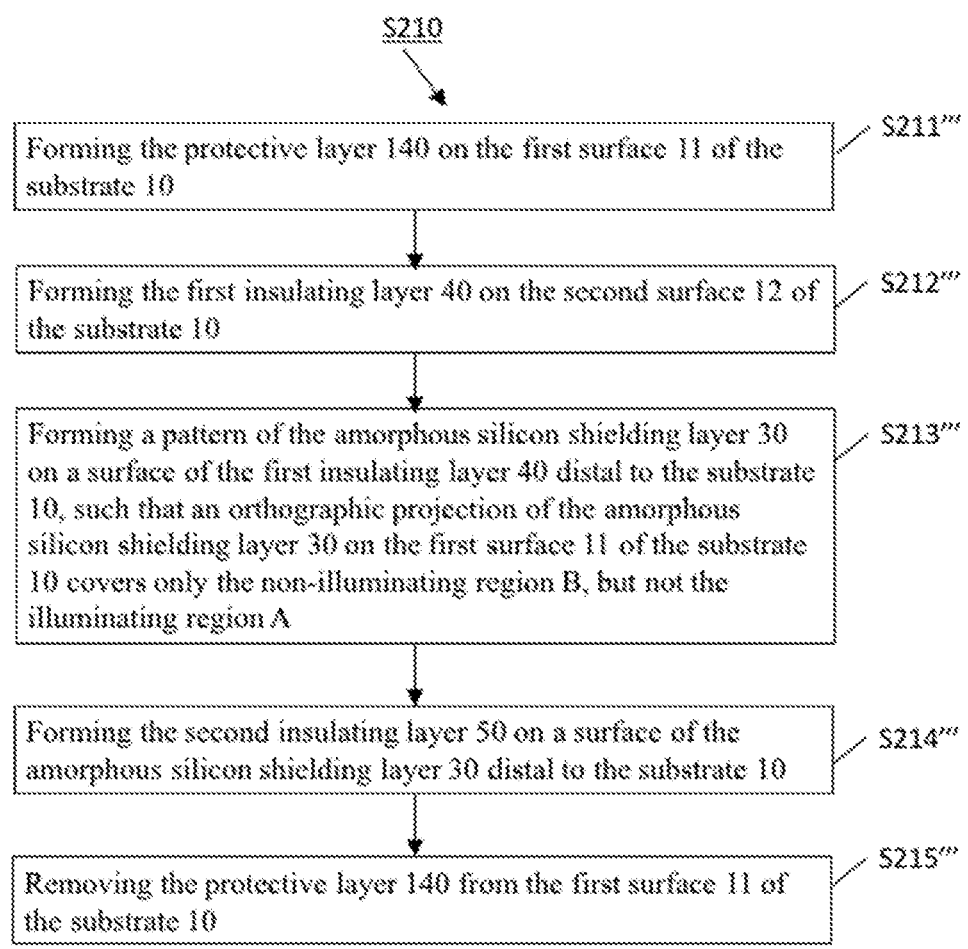
FIG. 11G illustrates a flow chart of the formation of the amorphous silicon shielding layer involving the formation and subsequent removal of a protective layer in the method for manufacturing an array substrate according to some other embodiments of the disclosure.
Figure 12:
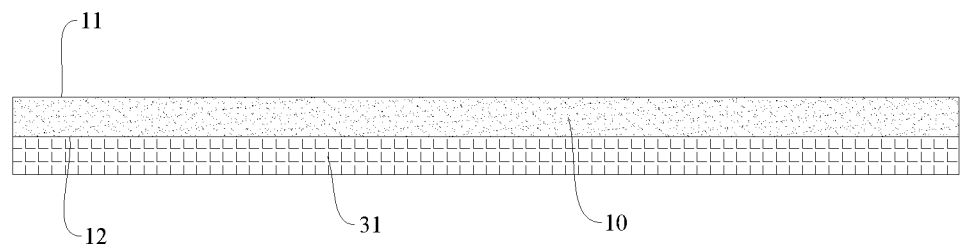
FIGS. 12-16 respectively illustrate an intermediate product after each of these sub-steps S211-215 as illustrated in FIG. 11D.
Figure 13:
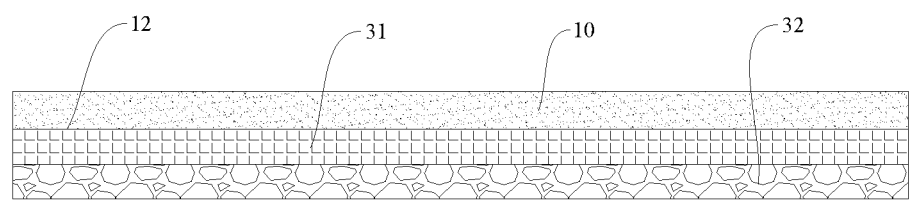
Figure 14:
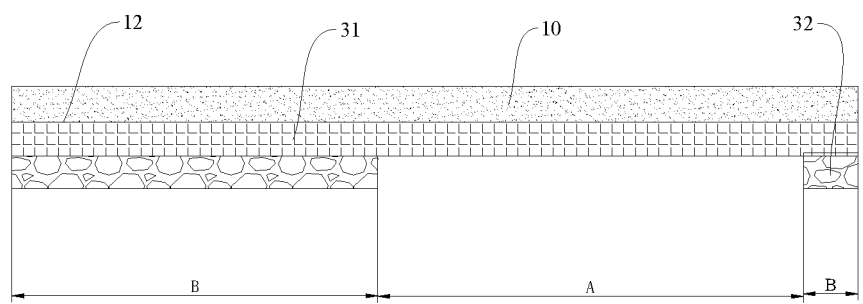
Figure 15:
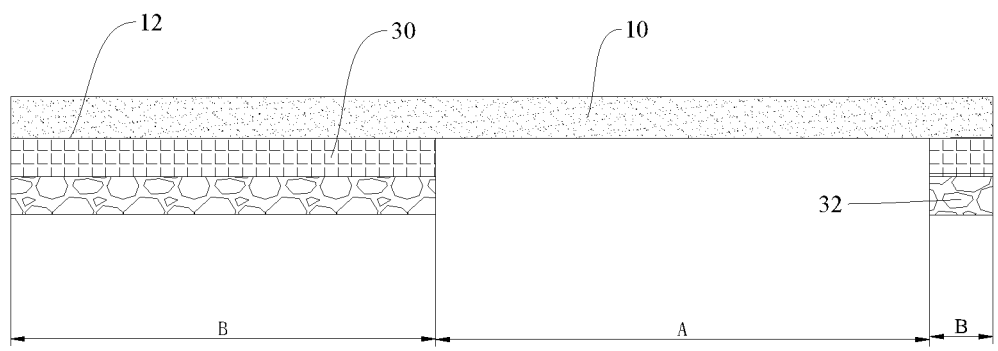
Figure 16:
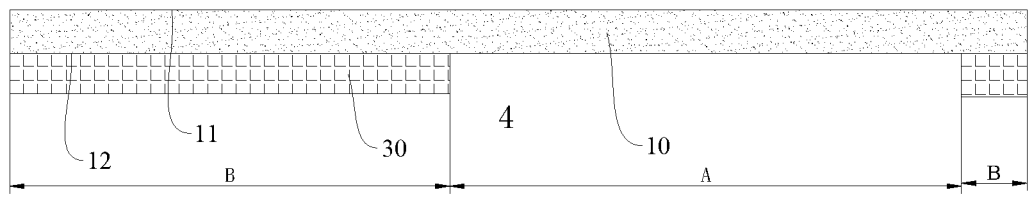
Figure 23:
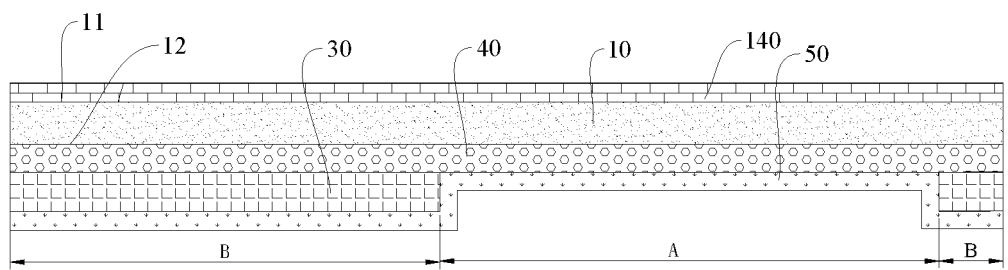
FIGS. 23-24 respectively illustrate an intermediate product after each of these sub-steps S214'''-215''' as illustrated in FIG. 11G.
Figure 24:
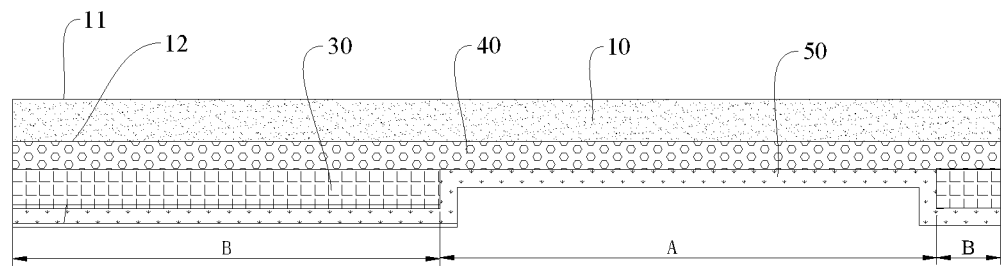

Take another embodiment where the array substrate comprises a first insulating layer 40, an amorphous silicon shielding layer 30, and a second insulating layer 50, sequentially formed over the second surface 12 of the substrate 10 as another illustrating example. As illustrated in FIG. 11G, the sub-step of forming the amorphous silicon shielding layer over the second surface of the substrate (i.e. the sub-step S210 as described above and illustrated in FIG. 11B) in the manufacturing method comprises the following sub-steps S211'''-S213''', and an intermediate product after each of these sub-steps is illustrated in FIGS. 20, 23, and 24.

S211''': Forming the protective layer 140 on the first surface 11 of the substrate 10 (the intermediate product illustrated in FIG. 20);

S212''': Forming the first insulating layer 40 on the second surface 12 of the substrate 10;

S213''': Forming a pattern of the amorphous silicon shielding layer 30 on a surface of the first insulating layer 40 distal to the substrate 10, such that an orthographic projection of the amorphous silicon shielding layer 30 on the first surface 11 of the substrate 10 covers only the non-illuminating region B, but not the illuminating region A;

S214''': Forming the second insulating layer 50 on a surface of the amorphous silicon shielding layer 30 distal to the substrate 10 (the intermediate product illustrated in FIG. 23); and S215''': Removing the protective layer 140 from the first surface 11 of the substrate 10 (the intermediate product illustrated in FIG. 24).

Following S215''', a step of forming the active layer 20 on the first surface 11 of the substrate 10 can be further performed, to thereby obtain an intermediate product illustrated in FIG. 8.

In any of the two embodiments as described above, the protective layer 140 can have a composition of a metal or a transparent conductive material (e.g. ITO), but other materials are also possible. The formation of the protective layer 140 on the first surface 11 of the substrate 10 can be realized by a chemical vapor deposition process, a physical vapor deposition process, or a sputtering process, etc. The removal of the protective layer 140 from the first surface 11 of the substrate 10 can be realized by a dry etching process or a wet etching process, etc.

Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. An array substrate, comprising:
    a substrate having a first surface and a second surface, opposing to each other;
    an active layer over the first surface of the substrate; and
    an amorphous silicon shielding layer comprising amorphous silicon, between the active layer and the substrate or over a side of the substrate proximal to the second surface of the substrate;
    wherein:
        an orthographic projection of the amorphous silicon shielding layer on the first surface at least partially covers an orthographic projection of the active layer on the first surface, such that the amorphous silicon shielding layer shields a light from shedding onto the active layer; and
        the amorphous silicon shielding layer is formed without patterning such that the orthographic projection of the amorphous silicon shielding layer on the first surface completely covers the first surface of the substrate; and
        the amorphous silicon shielding layer is formed with a reduced content of hydrogen gas ($H_2$) in a silane precursors by controlling the content of hydrogen gas ($H_2$) to be 10-30% in weight percentage, such that the amorphous silicon shielding layer is controlled to have a reduced hydrogen doping, resulting in a number of dangling bonds of at least $10^{20}$ cm$^{-3}$ to thereby increase a number of defects to thereby improve light absorption by the amorphous silicon shielding layer.

2. The array substrate of claim 1, further comprising a first insulating layer, wherein the first insulating layer is between the amorphous silicon shielding layer and the substrate.

3. The array substrate of claim 2, further comprising a second insulating layer, wherein the second insulating layer is over a surface of the amorphous silicon shielding layer distal to the substrate.

4. The array substrate of claim 1, wherein the amorphous silicon shielding layer is over the side of the substrate proximal to the second surface of the substrate, wherein:
    the array substrate further comprises a buffer layer, between the active layer and the first surface of the substrate.

5. A display panel, comprising an array substrate according to claim 1.

6. The display panel of claim 5, wherein the display panel is a top-emitting display panel.

7. The display panel of claim 6, wherein the display panel is an OLED display panel.

8. A method for manufacturing the array substrate of claim 1, the method comprising:
   providing the substrate having the first surface and the second surface opposingly arranged to each other; and
   forming the active layer and the amorphous silicon shielding layer comprising amorphous silicon over the substrate, such that:
      the active layer is over the first surface of the substrate; and
      the amorphous silicon shielding layer is between the active layer and the substrate or over a side of the substrate proximal to the second surface of the substrate, and the orthographic projection of the amorphous silicon shielding layer on the first surface at least partially covers the orthographic projection of the active layer on the first surface.

9. The method according to claim 8, wherein the forming the active layer and an amorphous silicon shielding layer comprises:
   forming a layer of amorphous silicon to completely cover the substrate.

10. The method according to claim 9, wherein the forming the active layer and the amorphous silicon shielding layer further comprises:
   performing an etching process to the layer of amorphous silicon such that a portion of the layer of amorphous silicon corresponding to an illuminating region of the array substrate is removed.

11. The method according to claim 10, wherein the forming the active layer and the amorphous silicon shielding layer further comprises:
   forming a protective layer on a surface of the substrate distal to the layer of amorphous silicon prior to the forming a layer of amorphous silicon to completely cover the substrate; and
   removing the protective layer from the surface of the substrate after the performing an etching process to the layer of amorphous silicon.

12. The method according to claim 11, wherein the protective layer comprises a metal or a transparent conductive material.

13. The method according to claim 12, wherein the protective layer comprises ITO.

14. The method according to claim 8, wherein:
   the forming the active layer and an amorphous silicon shielding layer further comprises, prior to the forming the layer of amorphous silicon to completely cover the substrate:
      forming a first insulating layer over the substrate, wherein the first insulating layer is arranged to be over a same surface of the substrate as the layer of amorphous silicon; and
   the forming a layer of amorphous silicon to completely cover the substrate comprises:
      forming the layer of amorphous silicon over a surface of the first insulating layer distal to the substrate.

15. The method according to claim 14, wherein the forming the active layer and the amorphous silicon shielding layer further comprises, after the performing an etching process to the layer of amorphous silicon:
   forming a second insulating layer over a surface of the amorphous silicon shielding layer distal to the substrate.

* * * * *